(12) United States Patent
Kim et al.

(10) Patent No.: US 11,353,643 B2
(45) Date of Patent: Jun. 7, 2022

(54) POLARIZING PLATE AND OPTICAL DISPLAY DEVICE INCLUDING SAME

(71) Applicant: SAMSUNG SDI CO., LTD., Yongin-si (KR)

(72) Inventors: Jin Woo Kim, Suwon-si (KR); Dong Yoon Shin, Suwon-si (KR); Ji Hyun Wi, Suwon-si (KR); Yeon Ju Jung, Suwon-si (KR)

(73) Assignee: Samsung SDI Co., Ltd., Yongin-si (KR)

(*) Notice: Subject to any disclaimer, the term of this patent is extended or adjusted under 35 U.S.C. 154(b) by 409 days.

(21) Appl. No.: 16/069,866

(22) PCT Filed: Jan. 18, 2017

(86) PCT No.: PCT/KR2017/000606
§ 371 (c)(1),
(2) Date: Jul. 12, 2018

(87) PCT Pub. No.: WO2017/126883
PCT Pub. Date: Jul. 27, 2017

(65) Prior Publication Data
US 2019/0025484 A1 Jan. 24, 2019

(30) Foreign Application Priority Data

Jan. 19, 2016 (KR) .................. 10-2016-0006203
Dec. 21, 2016 (KR) .................. 10-2016-0176026

(51) Int. Cl.
*G02B 5/30* (2006.01)
*G02B 1/14* (2015.01)
(Continued)

(52) U.S. Cl.
CPC ............ *G02B 5/305* (2013.01); *B32B 7/12* (2013.01); *G02B 1/14* (2015.01); *G02B 5/003* (2013.01);
(Continued)

(58) Field of Classification Search
CPC ....... B32B 7/12; G02F 1/00; G02F 1/133512; G02F 1/133528; G02B 1/14; G02B 5/003;
(Continued)

(56) References Cited

U.S. PATENT DOCUMENTS 6,838,185 B2 * 1/2005 Saiki .................. B32B 7/12
359/485.04
2010/0079718 A1 4/2010 Sekiya et al.
(Continued)

FOREIGN PATENT DOCUMENTS

CN        1831568 A     9/2006
CN      101432113 A     5/2009
(Continued)

OTHER PUBLICATIONS

Machine Translation of KR 10-2016-0002410 (Year: 2016).*
(Continued)

*Primary Examiner* — Sathavaram I Reddy
(74) *Attorney, Agent, or Firm* — Lewis Roca Rothgerber Christie LLP

(57) ABSTRACT

Provided are a polarizing plate, a method of manufacturing same, and a display device including same. The polarizing plate comprises: a polarizer; a polarizer protective film disposed on at least one surface of the polarizer; an adhesive layer interposed between the polarizer and the polarizer protective film; and a print layer interposed between the polarizer and the polarizer protective film, and formed on at least a portion of the edge of the adhesive layer. The print
(Continued)

layer comprises: a pigment; an organic resin binder; a reactive unsaturated compound; a photopolymerization initiator; and a solvent.

14 Claims, 5 Drawing Sheets

(51) Int. Cl.
  *G02B 5/00* (2006.01)
  *B32B 7/12* (2006.01)
  *G02F 1/1335* (2006.01)
  *H01L 51/52* (2006.01)

(52) U.S. Cl.
  CPC ..... *G02B 5/3033* (2013.01); *G02F 1/133512* (2013.01); *G02F 1/133528* (2013.01); *H01L 51/5281* (2013.01); *Y10T 428/24876* (2015.01); *Y10T 428/24901* (2015.01)

(58) Field of Classification Search
  CPC ... G02B 5/3033; G02B 5/305; H01L 51/5281; Y10T 428/24876; Y10T 428/24901
  See application file for complete search history.

(56) References Cited

U.S. PATENT DOCUMENTS

| | | | |
|---|---|---|---|
| 2011/0211136 A1 | 9/2011 | Kubota et al. | |
| 2012/0188638 A1* | 7/2012 | Nakata | G02B 1/14 359/485.01 |
| 2016/0109631 A1 | 4/2016 | Mizutani et al. | |
| 2016/0363795 A1 | 12/2016 | Jeon et al. | |
| 2016/0377914 A1 | 12/2016 | Miyashita et al. | |

FOREIGN PATENT DOCUMENTS

| | | | |
|---|---|---|---|
| CN | 102736779 A | | 10/2012 |
| CN | 103129073 A | | 6/2013 |
| CN | 103323991 A | | 9/2013 |
| CN | 104685552 A | | 6/2015 |
| CN | 105929476 A | | 9/2016 |
| JP | 2001-66609 A | | 3/2001 |
| JP | 2010-79180 A | | 4/2010 |
| JP | 2011-074308 | | 4/2011 |
| JP | 2013-254116 A | | 12/2013 |
| JP | 2015087405 A | * | 5/2015 |
| JP | 2016-65928 A | | 4/2016 |
| JP | 2016-170271 A | | 9/2016 |
| KR | 10-2013-0050917 A | | 5/2013 |
| KR | 10-1427473 B1 | | 8/2014 |
| KR | 10-2015-0007571 A | | 1/2015 |
| KR | 10-2015-0015243 A | | 2/2015 |
| KR | 10-2016-0002410 A | | 1/2016 |
| TW | 201322083 A | | 6/2013 |
| TW | 201337394 A | | 9/2013 |
| TW | 201432528 A | | 8/2014 |
| TW | 201502699 A | | 1/2015 |
| TW | 201623514 A | | 7/2016 |

OTHER PUBLICATIONS

Machine Translation of KR 10-2015-0007571 (Year: 2015).*
Machine Translation of JP 2015-087405 (Year: 2015).*
China Office Action dated Jan. 20, 2020 in corresponding Chinese Patent Application No. 201780007418.7 (9 pgs.).
Office action issued in TW 10720266920 dated Mar. 27, 2018, including English summary, 8 pages.
Taiwan Office Action for Taiwan Application No. 106140245, Taiwan Office Action dated Feb. 15, 2020 (7 pages).
China Office Action for Chinese Patent Application No. 201780079179.6, China Office Action dated Dec. 3, 2020 (9 pages).
U.S. Office Action dated Apr. 29, 2021, issued in U.S. Appl. No. 16/470,156 (14 pages).
U.S. Final Office Action dated Oct. 18, 2021, issued in U.S. Appl. No. 16/470,156 (14 pages).
U.S. Advisory Action dated Dec. 29, 2021, issued in U.S. Appl. No. 16/470,156 (5 pages).

* cited by examiner

【FIG. 1】
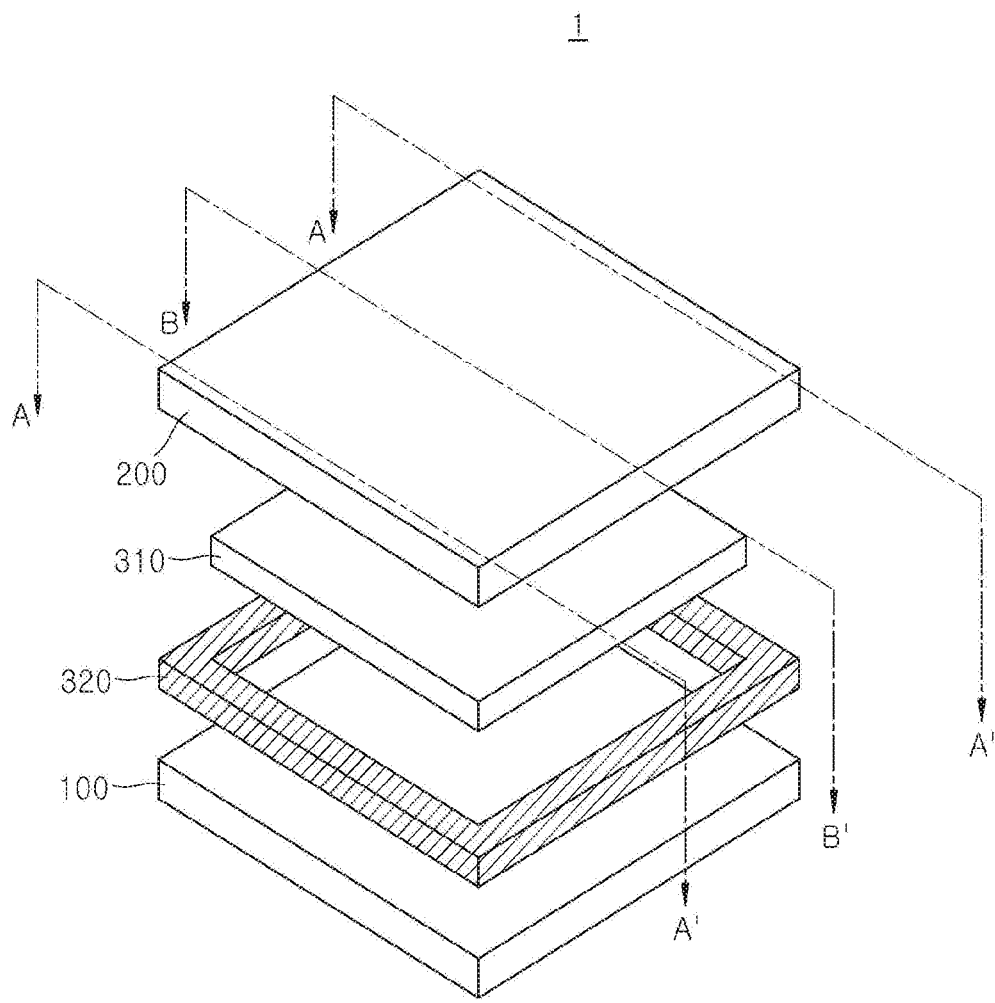
【FIG. 2】
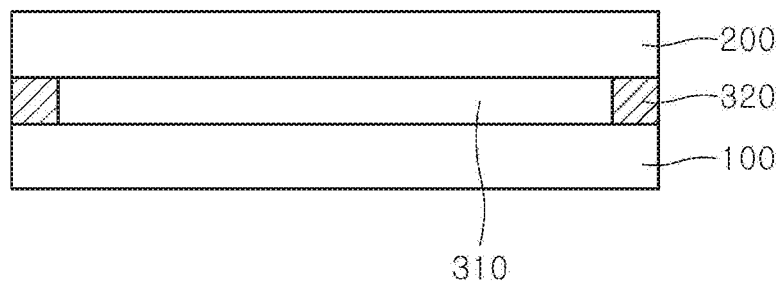

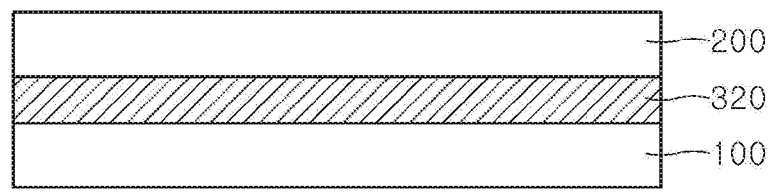
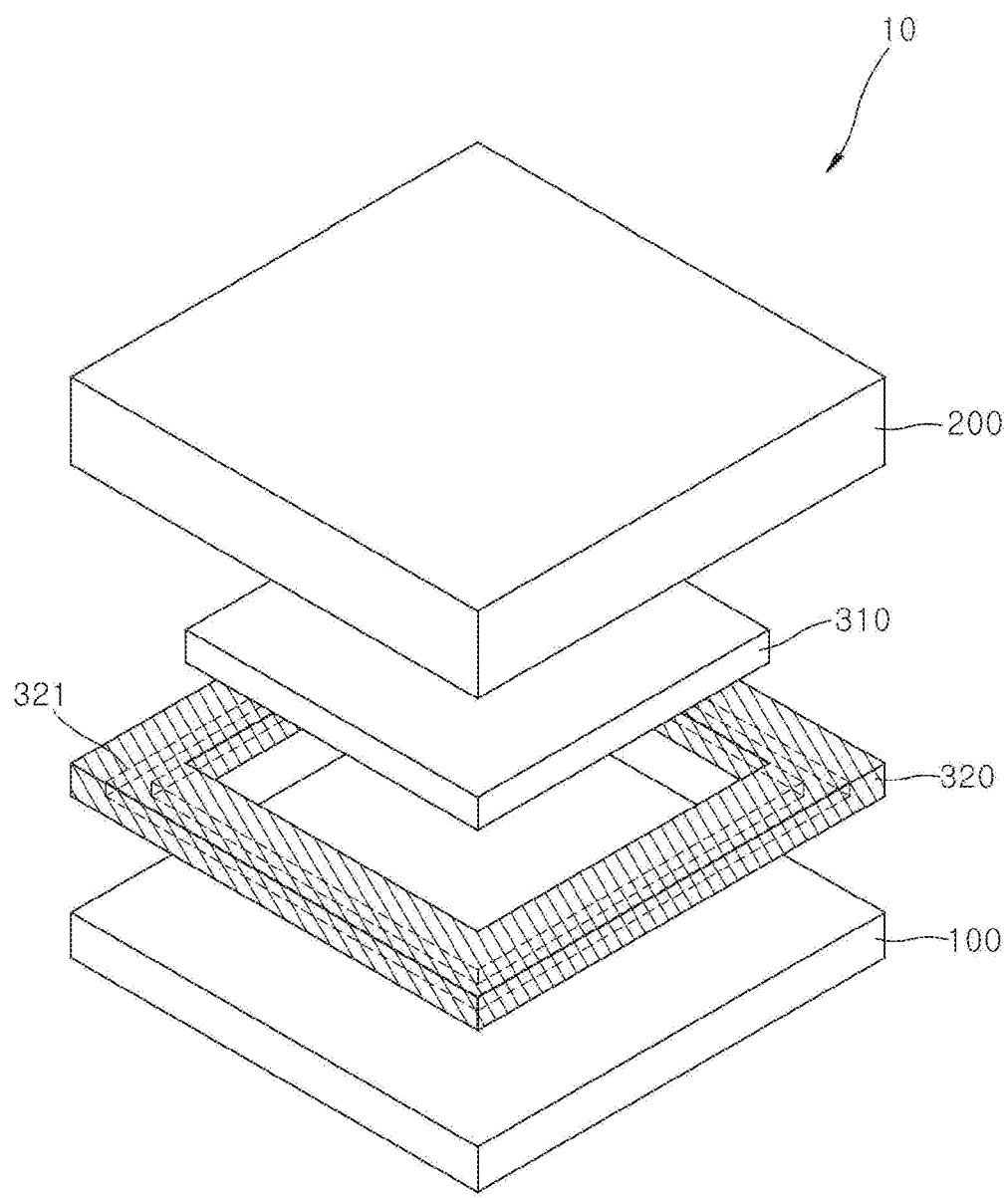

[FIG. 5]
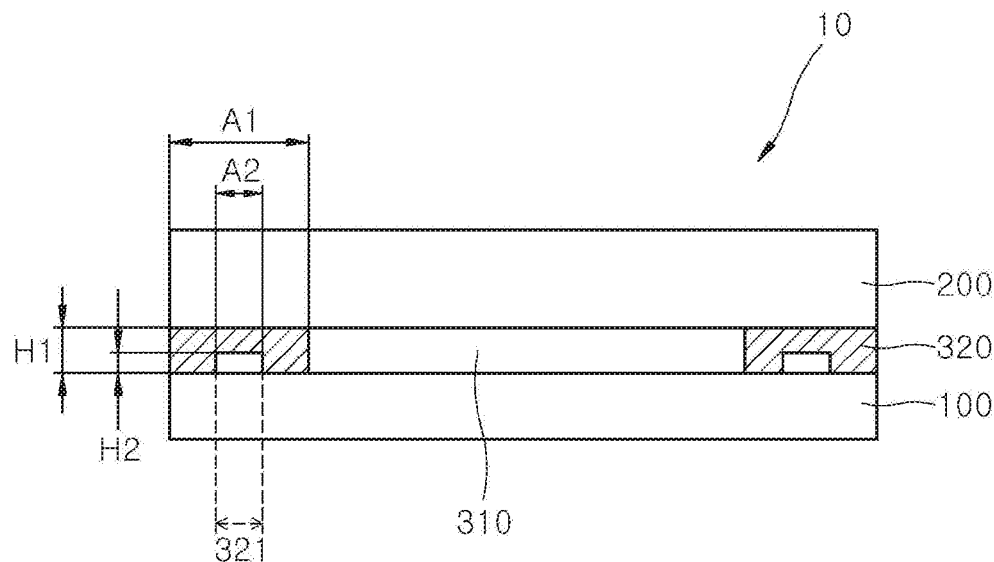
[FIG. 6]
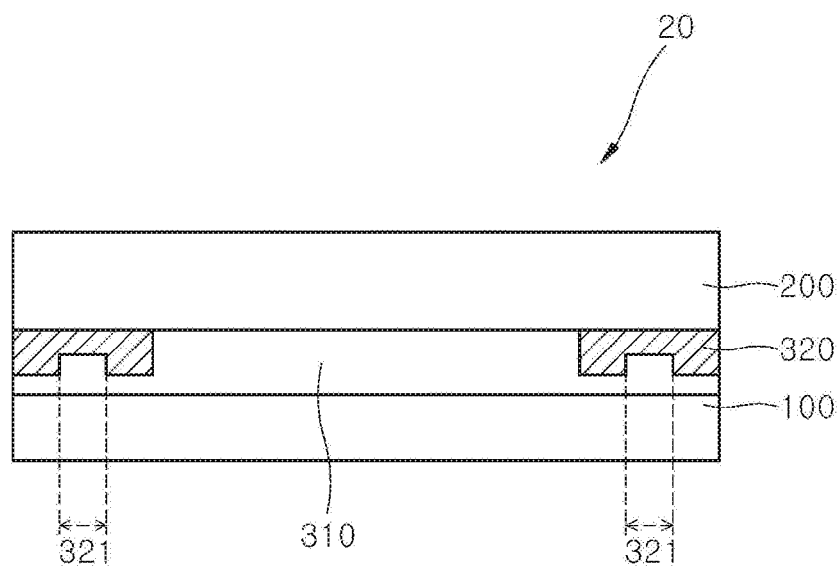

[FIG. 7]
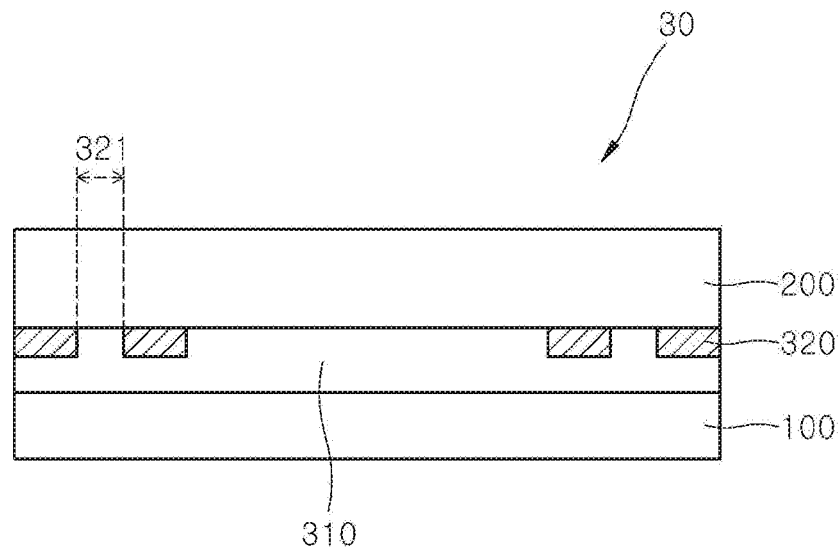
[FIG. 8]
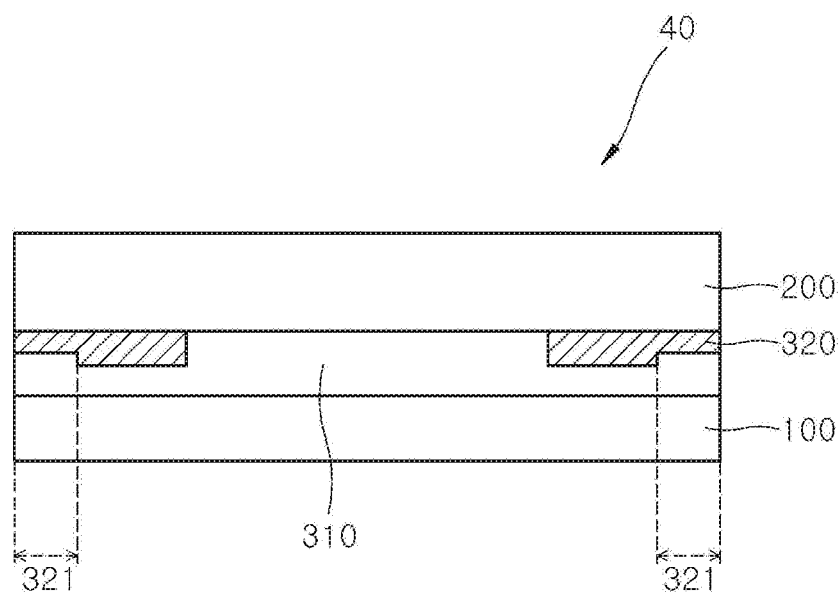

[FIG. 9]
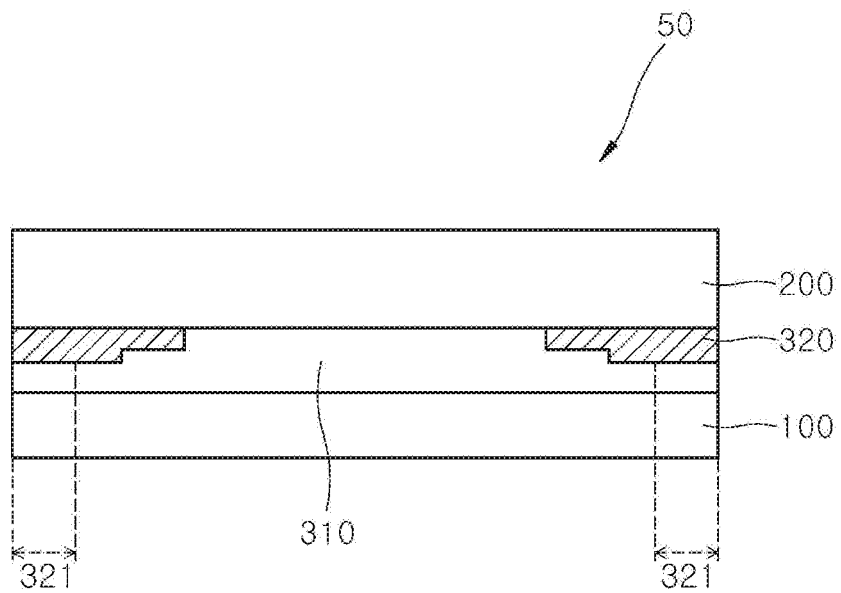
[FIG. 10]
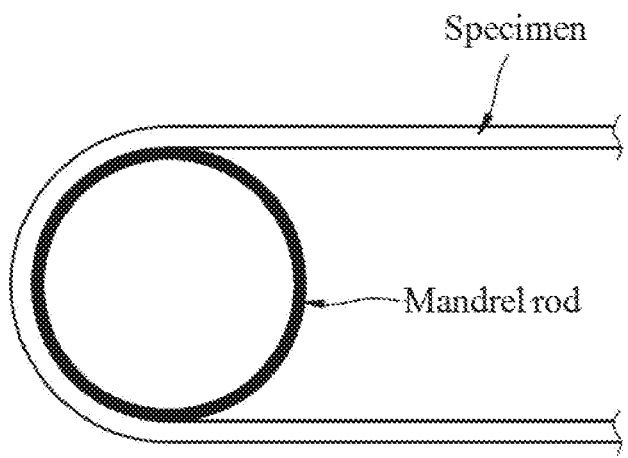

POLARIZING PLATE AND OPTICAL DISPLAY DEVICE INCLUDING SAME

CROSS-REFERENCE TO RELATED APPLICATION(S)

This application is a National Phase Patent Application and claims priority to and the benefit of International Application Number PCT/KR2017/000606, filed on Jan. 18, 2017, which claims priority to and the benefit of Korean Patent Application No. 10-2016-0006203, filed on Jan. 19, 2016, and which claims priority to and the benefit of Korean Patent Application No. 10-2016-0176026, filed Dec. 21, 2016, the entire contents of each of which are incorporated herein by reference.

TECHNICAL FIELD

The present invention relates to a polarizing plate and an optical display including the same.

BACKGROUND ART

A liquid crystal display or an organic light emitting display provides gradation for each pixel by optically modulating transmission light or adjusting self-luminance of pixels in response to input image signals. A layer adapted to modulate such transmission light or luminous brightness is referred to as a modulation function layer. The liquid crystal display includes a liquid crystal layer as the modulation function layer and the organic light emitting display includes an organic light emitting layer as the modulation function layer.

Since the liquid crystal layer per se is not a light valve for completely blocking light, the liquid crystal display is provided with polarizing plates at both sides of the liquid crystal layer in the vertical direction, that is, at a backlight side and a viewer side of the liquid crystal display.

On the other hand, since the organic light emitting layer of the organic light emitting display does not emit light upon application of no voltage thereto, the organic light emitting display can display a complete black color and provide higher contrast than the liquid crystal display. Thus, the polarizing plate is not provided to organic light emitting devices for the purpose of blocking light. However, external light can be reflected by metal wires in the light emitting device, thereby causing contrast deterioration. The polarizing plate is provided to prevent this problem.

Such an optical display may include a display region for displaying images and a non-display region surrounding the display region in horizontal cross-sectional view, and a black matrix or printed layer may be formed in a region in which the display region overlaps the non-display region so as to prevent interior elements arranged outside the display region from being viewed from the outside.

The background technique of the present invention is disclosed in Korean Patent Laid-open Publication No. 2015-0015243.

SUMMARY

It is one aspect of the present invention to provide a polarizing plate that includes a printed layer to prevent elements in a non-display region from being viewed from the outside and can achieve further reduction in thickness of an optical display. It is another aspect of the present invention to provide a polarizing plate that can prevent generation of cracks when applied to a non-display region having a curved end.

In accordance with one aspect of the present invention, a polarizing plate includes: a polarizer; a polarizer protective film disposed on at least one surface of the polarizer; a bonding layer interposed between the polarizer and the polarizer protective film; and a printed layer interposed between the polarizer and the polarizer protective film and formed on at least a portion of an edge of the bonding layer, wherein the printed layer includes a pigment, an organic binder resin, a reactive unsaturated compound, a photopolymerization initiator, and a solvent.

The printed layer may include may include about 1% by weight (wt %) to about 50 wt % of the pigment, about 0.5 wt % to about 20 wt % of the organic binder resin, about 1 wt % to about 20 wt % of the reactive unsaturated compound, and about 0.1 wt % to about 10 wt % of the photopolymerization initiator.

The bonding layer may be absent between the polarizer and the printed layer and between the polarizer protective film and the printed layer.

The bonding layer may have a thickness of about 0.5 μm to about 4 μm.

The printed layer may have a thickness of about 0.1 μm to about 2 μm.

The printed layer may surround a circumference of the bonding layer.

The polarizing plate may further include a curve securing portion on at least one surface of the printed layer.

In accordance with another aspect of the present invention, a polarizing plate includes: a polarizer; a polarizer protective film disposed on at least one surface of the polarizer; a printed layer interposed between the polarizer and the polarizer protective film; and a bonding layer interposed between the polarizer and the polarizer protective film and disposed at least partially inside the printed layer, wherein the printed layer includes a pigment, an organic binder resin, a reactive unsaturated compound, a photopolymerization initiator, and a solvent.

The bonding layer may be absent between the polarizer and the printed layer.

The bonding layer may be absent between the polarizer protective film and the printed layer.

The printed layer may be disposed on an outer periphery of a horizontal cross-section of the polarizer and the polarizer protective film.

In accordance with a further aspect of the present invention, a method of manufacturing a polarizing plate includes: preparing a polarizer protective film and a polarizer; forming a printed layer on an outer periphery of one surface of the polarizer protective film; forming a bonding layer by depositing a resin for the printed layer onto one surface of the polarizer protective film having the printed layer formed thereon; and coupling the polarizer to the polarizer protective film such that the printed layer is interposed between the polarizer and the polarizer protective film, wherein the resin for the printed layer may include a pigment, an organic binder resin, a reactive unsaturated compound, a photopolymerization initiator, and a solvent.

The resin for the printed layer may include about 1 wt % to about 50 wt % of the pigment, about 5 wt % to about 20 wt % of the organic binder resin, about 1 wt % to about 10 wt % of the reactive unsaturated compound, about 1 wt % to about 10 wt % of the photopolymerization initiator; and the balance of the solvent.

By the step of depositing the resin for the bonding layer, the bonding layer may be disposed at least partially inside the printed layer.

By the step of depositing the resin for the bonding layer, the bonding layer may be absent between the printed layer and the polarizer and between the printed layer and the polarizer protective film.

In accordance with a further aspect of the present invention, an optical display device may include the polarizing plate according to the present invention.

The present invention provides a polarizing plate that includes a printed layer to prevent elements in a non-display region from being viewed from the outside and can prevent generation of cracks when applied to a non-display region having a curved end.

The present invention provides a polarizing plate that can achieve further reduction in thickness of an optical display.

BRIEF DESCRIPTION OF THE DRAWINGS

FIG. 1 is an exploded perspective view of a polarizing plate according to one embodiment of the present invention.

FIG. 2 is a cross-sectional view of the polarizing plate taken along line A-A' of FIG. 1.

FIG. 3 is a cross-sectional view of the polarizing plate taken along line B-B' of FIG. 1.

FIG. 4 is a perspective view of a polarizing plate according to another embodiment of the present invention.

FIG. 5 is a cross-sectional view of the polarizing plate according to another embodiment of the present invention.

FIG. 6 is a cross-sectional view of a polarizing plate according to a further embodiment of the present invention.

FIG. 7 is a cross-sectional view of a polarizing plate according to yet another embodiment of the present invention.

FIG. 8 is a cross-sectional view of a polarizing plate according to yet another embodiment of the present invention.

FIG. 9 is a cross-sectional view of a polarizing plate according to yet another embodiment of the present invention.

FIG. 10 is a conceptual view for evaluation of crack generation upon bending.

DETAILED DESCRIPTION

Hereinafter, embodiments of the present invention will be described in detail with reference to the accompanying drawings such that the present invention can be easily realized by a person having ordinary knowledge in the art. It should be understood that the present invention is not limited to the following embodiments and may be embodied in different ways. In the drawings, portions irrelevant to the description will be omitted for clarity. Like components will be denoted by like reference numerals throughout the specification.

Herein, spatially relative terms such as "upper" and "lower" are defined with reference to the accompanying drawings. Thus, it will be understood that the term "upper surface" can be used interchangeably with the term "lower surface", and when an element such as a layer or a film is referred to as being placed "on" another element, it can be directly placed on the other element, or intervening element (s) may be present. On the other hand, when an element is referred to as being placed "directly on" another element, there are no intervening element(s) therebetween.

As used herein, the term "embedded" means not only a structure wherein a printed layer is present inside a bonding layer, but also a structure wherein the printed layer is formed such that one surface of the printed layer adjoins the bonding layer (the printed layer has the same thickness as the bonding layer).

FIG. 1 is an exploded perspective view of a polarizing plate according to one embodiment of the present invention, FIG. 2 is a cross-sectional view of the polarizing plate taken along line A-A' of FIG. 1, and FIG. 3 is a cross-sectional view of the polarizing plate taken along line B-B' of FIG. 1. Hereinafter, the polarizing plate according to one embodiment of the invention will be described with reference to FIG. 1 to FIG. 3.

A polarizing plate 1 according to one embodiment of the invention includes a polarizer 100, a polarizer protective film 200 disposed on at least one surface of the polarizer 100, a bonding layer 310 interposed between the polarizer 100 and the polarizer protective film 200, and a printed layer 320 interposed between the polarizer 100 and the polarizer protective film 200 and surrounding the periphery of the bonding layer 310.

The printed layer 320 may be formed of a photocurable composition, which includes a pigment dispersion, an organic binder resin, a reactive unsaturated compound, and a photopolymerization initiator. With these components, the printed layer 320 may be formed to a further reduced thickness.

The pigment may include carbon black, a mixed pigment of silver-tin alloys, or a combination thereof. Examples of the carbon black may include carbon graphite, furnace black, acetylene black, and Ketjen black, without being limited thereto.

The organic resin binder may include an acrylic resin, a polyimide resin, a polyurethane resin, or a combination thereof. Examples of the acrylic resin may include methacrylic acid/benzyl methacrylate copolymer, methacrylic acid/benzyl methacrylate/styrene copolymer, methacrylic acid/benzyl methacrylate/2-hydroxyethyl methacrylate copolymer, and methacrylic acid/benzyl methacrylate/styrene/2-hydroxyethyl methacrylate copolymer, without being limited thereto. The polyurethane resin may include aliphatic polyurethane, without being limited thereto.

Examples of the reactive unsaturated compound may include ethylene glycol diacrylate, ethylene glycol dimethacrylate, diethylene glycol diacrylate, triethylene glycol diacrylate, triethylene glycol dimethacrylate, 1,6-hexanediol diacrylate, 1,6-hexanediol dimethacrylate, pentaerythritol triacrylate, pentaerythritol tetraacrylate, dipentaerythritol pentaacrylate, dipentaerythritol hexaacrylate, bisphenol A epoxy acrylate, ethylene glycol monomethyl ether acrylate, trimethylolpropane triacrylate, and tris(meth)acryloyloxyethyl phosphate, without being limited thereto.

Examples of the photopolymerization initiator may include acetophenone, benzophenone, thioxanthene, benzoin, and triazine compounds, without being limited thereto.

The solvent may include glycol ethers such as ethylene glycol methyl ether, ethylene glycol ethyl ether, propylene glycol methyl ether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethyl ether, diethylene glycol monoethyl ether, diethylene glycol dimethyl ether, diethylene glycol methylethyl ether, diethylene glycol diethyl ether, and the like; and propylene glycol alkyl ether acetates such as propylene glycol methyl ether acetate, propylene glycol propyl ether acetate, and the like, without being limited thereto.

The composition for printed layer 320 may include about 1 wt % to about 50 wt % of the pigment, about 0.5 wt % to about 20 wt % of the organic binder resin, about 1 wt % to about 20 wt % of the reactive unsaturated compound, about 0.1 wt % to about 10 wt % of the photopolymerization initiator, and the balance of the solvent. Within these ranges, the printed layer 320 can be formed to a thin thickness while exhibiting a good light shielding effect.

The composition for the printed layer 320 may further include about 0.1 wt % to about 1 wt % of additives. The additives may include a silane coupling agent to assist in UV curing of the printed layer 320.

In an optical display, the polarizing plate is disposed on a display panel and a cover window formed of glass is disposed at the outermost side of the optical display. The optical display includes a display region on which an image is displayed and a non-display region in which a printed circuit board and driving chips are mounted. The non-display region is shielded by a shielding layer or a printed layer so as not to be viewed by a user of the optical display. Generally, in order to shield the non-display region from being visible from the outside, the printed layer is formed on the cover window or a separate printed tape is attached thereto.

According to the present invention, since the printed layer is interposed between the polarizer 100 and the polarizer protective film 200, the polarizing plate does not require formation of a separate printed layer on the cover window. In addition, the printed layer 320 is formed of the composition including the components described above, thereby enabling further reduction in thickness of the optical display.

The printed layer 320 may have a thickness of about 0.1 μm to about 2 μm. The bonding layer 310 may have a thickness of about 0.5 μm to about 4 μm. It is desirable that the printed layer have substantially the same thickness as the bonding layer in order to reduce thickness deviation therebetween while improving external appearance of the polarizing plate.

The polarizer 100 is a film capable of converting natural light or polarized light into arbitrary polarized light, generally specific linearly polarized light. The polarizer 100 may include polarizers obtained by adsorbing iodine or a dichroic material such as dichroic dyes onto a hydrophilic polymer film such as a polyvinyl alcohol film, a partially formalized polyvinyl alcohol film, or a partially saponified ethylene-vinyl acetate copolymer film, followed by stretching the hydrophilic polymer film; oriented polyene films, such as products obtained by dehydration of polyvinyl alcohols and products obtained by hydrochloric acid treatment of polyvinyl chloride, without being limited thereto. In one embodiment, the polarizer 100 may include an iodine-containing polyvinyl alcohol film, which has a high degree of polarization and exhibits good adhesion to the polarizer protective film 200, without being limited thereto.

The polarizer protective film 200 may be formed on one surface of the bonding layer 310 to support the bonding layer 310 and the polarizer 100.

The polarizer protective film 200 may be an optically transparent protective film. For example, the polarizer protective film may be formed of at least one selected from among polyesters such as polyethylene terephthalate (PET), polybutylene terephthalate, polyethylene naphthalate, and polybutylene naphthalate, acryl, cyclic olefin polymer (COP), cellulose esters such as triacetylcellulose (TAC) resins, polyvinyl acetate, polyvinyl chloride (PVC), polynorbornene, polycarbonate (PC), polyamide, polyacetal, polyphenylene ether, polyphenylene sulfide, polysulfone, polyether sulfone, polyarylate, and polyimide.

In one embodiment, the polarizer protective film may include a polyester material. By way of example, the polarizer protective film may be formed of an aromatic polyester material in order to secure crystallinity. For example, the polarizer protective film may be formed of polyethylene terephthalate (PET), polyethylene naphthalate (PEN), or a copolymer resin including the same, without being limited thereto. The polarizer protective film may have a triple co-extrusion structure including polyethylene terephthalate, polyethylene naphthalate, or a copolymer resin including the same. The polyester film may be formed by melt-extrusion of, for example, the polyester resin into a film shape, followed by cooling the polyester resin on a casting drum. The polarizer protective film 200 is well known in the art and thus description of details thereof will be omitted herein.

The polarizer protective film 200 may have a thickness of about 30 μm to about 120 μm, specifically about 20 μm to about 80 μm. Within this thickness range, the polarizer protective film can be used for an optical display.

Although not shown in FIGS. 1 to 3, a functional layer may be further formed on the polarizer protective film 200. The functional layer may provide at least one function of anti-reflection, low reflection, hard coating, anti-glare, anti-fingerprint, anti-contamination, diffusion, and refraction functions, without being limited thereto.

The bonding layer 310 may be interposed between the polarizer 100 and the polarizer protective film 200 and may be formed on at least part of the polarizer 100 and the polarizer protective film 200. In other words, the polarizer 100 and the polarizer protective film 200 may face each other and have substantially the same cross-sectional area in horizontal cross-sectional view. That is, the polarizer 100 and the polarizer protective film 200 may completely overlap each other in horizontal cross-sectional view. The bonding layer 310 may be formed on at least part of the polarizing film 100 and the polarizer protective film 200. More specifically, the bonding layer 310 may be disposed in an island shape only at the center of the polarizer 100 and the polarizer protective film 200 excluding the peripheries thereof.

The bonding layer 310 serves to bond or couple the polarizer 100 and the polarizer protective film 200 to each other, and may include a water-based bonding agent or a UV-curable bonding agent.

The water-based bonding agent may include at least one selected from the group consisting of polyvinyl alcohol resins and vinyl acetate resins, or may include a polyvinyl alcohol resin having a hydroxyl group, without being limited thereto.

Examples of the UV-curable bonding agent may include acrylic, urethane-acrylic, and epoxy bonding agents, without being limited thereto.

When the bonding layer 310 is formed of the water-based bonding agent, the bonding layer 310 may have a thickness of about 0.5 μm to about 4 μm, for example, a thickness of about 0.5 μm to about 0.9 μm. When the bonding agent 310 is formed of the UV-curable bonding agent, the bonding layer 310 may have a thickness of about 0.5 μm to about 4 μm, for example, a thickness of about 2 μm to about 4 μm. When the thickness of the bonding layer falls within this range, a gap generated between the polarizer 100 and the polarizer protective film 200 due to the printed layer 320 can be filled with the bonding layer, thereby improving durability of the polarizing plate. That is, the bonding layer 310 can minimize deviation between a region in which the printed layer 320 is present and a region in which the printed layer 320 is not present between the polarizer 100 and the polarizer protective film 200.

The printed layer 320 may be disposed between the polarizer 100 and the polarizer protective film 200 to surround the periphery of the bonding layer 310. That is, the bonding layer 310 may be absent between the polarizer 100 and the printed layer 320 and between the polarizer protective film 200 and the printed layer 320.

That is, the printed layer 320 may be disposed between the polarizer 100 and the polarizer protective film 200 such that an inner space of the printed layer is partially open. That is, the printed layer 320 has a closed loop shape and may include a partially vacant area. Accordingly, the interior of the printed layer 320 can be defined as a vacant space inside the printed layer 320 forming a closed loop. In other words, the printed layer 320 may be disposed in at least part or the entirety of an outer periphery in a horizontal cross-section of the polarizer 100 and the polarizer protective film 200, without being limited thereto.

The printed layer 320 is formed of the composition described above, which imparts adhesive strength to the printed layer 320, whereby the polarizer 100 can be coupled to the polarizer protective film 200 thereby. Thus, even in the case where the bonding layer 310 is not present between the polarizer 100 and the printed layer 320 and between the polarizer protective film 200 and the printed layer 320, the polarizer 100 can be coupled to the polarizer protective film 200 by the printed layer 320.

The printed layer 320 can shield or absorb light and may include a certain mark such as a company logo, a dot pattern, and the like. Namely, a certain pattern may be formed on the printed layer 320 to provide an aesthetically pleasing appearance to an optical display.

On the other hand, the bonding layer 310 may have the same thickness as the printed layer 320. As shown in FIG. 2, in the structure wherein the printed layer 320 is formed along the outer periphery between the polarizer 100 and the polarizer protective film 200 and the bonding layer 310 is formed inside the printed layer 320, the bonding layer 310 may have the same thickness as the printed layer 320.

Although not shown in the drawings, a primer layer and an adhesive layer may be disposed on the other surface of the polarizer opposite one surface of the polarizer on which the printed layer is formed. In addition, a release film may be disposed on an outer surface of the adhesive layer to facilitate maintenance and delivery of the polarizing plate. The adhesive layer may be used to attach the polarizing plate to a display panel. In addition, the primer layer may be used to protect the polarizer and improve adhesion between the polarizing plate and the display panel. The primer layer may be formed by coating a coating liquid including a water-dispersible polymer resin, water-dispersible fine particles and water onto the polarizer by bar coating, gravure coating, or the like, followed by drying.

In another embodiment, another polarizer protective film may be stacked on one surface of the polarizer, with the bonding layer formed on the other surface of the polarizer, and an adhesive layer may be disposed on the other surface of the other surface of the polarizer protective film to attach the polarizing plate to a display panel. Other components are the same as those described above, and thus repeated description thereof will be omitted.

A polarizing plate according to another embodiment of the invention includes: a polarizer; a polarizer protective film disposed on at least one surface of the polarizer; a bonding layer interposed between the polarizer and the polarizer protective film, and a printed layer formed on at least part of an edge of the bonding layer to be embedded in the bonding layer, wherein the printed layer has a curve securing portion formed on at least one surface thereof. In application of the polarizing plate to an optical display, the curve securing portion corresponds to a contact portion between the polarizing plate and a curved edge of the optical display and prevents generation of cracks at a curved portion of the polarizing plate disposed to surround the curved edge of the optical display.

Next, a polarizing plate according to another embodiment of the invention will be described with reference to FIG. 4 and FIG. 5. FIG. 4 is a perspective view of a polarizing plate according to another embodiment of the present invention and FIG. 5 is a cross-sectional view of the polarizing plate according to another embodiment of the present invention.

Referring to FIG. 4 and FIG. 5, a polarizing plate 10 according to this embodiment of the invention includes a polarizer 100, a polarizer protective film 200 disposed on one surface of the polarizer 100, and a bonding layer 310 and a printed layer 320 interposed between the polarizer 100 and the polarizer protective film 200.

The printed layer 320 is embedded in the bonding layer 310. Specifically, the printed layer 320 is formed along an edge of the bonding layer 310 and contacts one surface of the bonding layer 310. Referring to FIGS. 4 and 5, the printed layer 320 is formed to surround the edge of the bonding layer 310. The printed layer 320 is not formed as a separate layer from the bonding layer 310 and thus enables reduction in thickness of an optical display. The printed layer 320 corresponds to a non-display region of the optical display when the polarizing plate is mounted on the optical display.

The printed layer 320 is formed on a light exit surface of the polarizer 100. Thus, a display function can be realized in a region of the polarizing plate, in which the printed layer 320 is not formed. Alternatively, the printed layer 320 may also be formed on a light incident surface of the polarizing film 100.

The thickness H1 of the printed layer 320 may be less than or equal to the thickness of the bonding layer 310. FIG. 4 shows the structure wherein the printed layer 320 has the same thickness as the bonding layer 310. The thickness H1 of the printed layer 320 may be about 50% to about 100% the thickness of the bonding layer 310. Within this thickness range, the printed layer 320 can be embedded in the bonding layer and enable reduction in thickness of the polarizing plate. For example, the printed layer 320 may have a thickness H1 of about 0.1 µm to about 4 µm, preferably about 1.0 µm to about 4.0 µm. Within this thickness range, the printed layer 320 can be embedded in the bonding layer and can secure light shielding while allowing reduction in thickness of the polarizing plate.

The printed layer 320 is directly formed on one surface of the polarizer protective film 200. This structure can realize further reduction in thickness of an optical display. Herein, the expression "directly formed on" means that there are no intervening layers, such as an adhesive layer, a bonding layer or an adhesive-bonding layer, between the printed layer 320 and the polarizer protective film 200.

The printed layer 320 may be disposed between the polarizer 100 and the polarizer protective film 200 such that an inner space of the printed layer is partially open. That is, the printed layer 320 has a closed loop shape and may include a partially vacant area. Accordingly, the inner space of the printed layer 320 can be defined as a vacant space inside the printed layer 320 forming a closed loop. In other words, the printed layer 320 may be disposed in at least part or the entirety of an outer periphery in a horizontal cross-section of the polarizer 100 and the polarizer protective film 200, without being limited thereto.

The printed layer 320 may be formed of the composition for the printed layer described above.

The printed layer 320 has a curve securing portion 321 formed on at least one surface thereof.

The curve securing portion 321 is formed on at least one surface of the printed layer 320 and is an engraved pattern having a predetermined cross-section. As described below, the curve securing portion 321 has the same or smaller height than the printed layer 320 and includes a step portion. The curve securing portion 321 allows the polarizing plate to be bent without generating cracks when the polarizing plate is coupled to a curved edge portion of an optical display via the curve securing portion. Thus, when the curved edge portion of the optical display is surrounded by the polarizing plate according to the present invention, the curve securing portion serves to relieve stress applied to the polarizing plate due to the curved edge of the optical display, thereby preventing generation of cracks at the curved edge portion. Preferably, the curve securing portion 321 is formed on a surface of the printed layer 320 opposite the surface of the printed layer 320 adjoining one surface of the polarizer protective film 200. For example, the curve securing portion 321 is formed on the printed layer 320 at a light exit side of the polarizer 100.

The curve securing portion 321 is formed inside one surface of the printed layer 320. However, the location of the curve securing portion 321 on the printed layer 320 can be changed depending upon a curved edge portion of an optical display to be used.

The curve securing portion 321 is an engraved pattern having a predetermined cross-section. The curve securing portion 321 may have the same or larger cross-sectional area than an edge of an optical display to be coupled to the curve securing portion. Referring to FIG. 4, the curve securing portion 321 is an engraved pattern having a rectangular cross-section. However, the cross-sectional shape of the curve securing portion 321 is not limited thereto and may be an n-gonal shape consisting of n planes (n being an integer of 3 to 10). Alternatively, the curve securing portion 321 may have a cross-sectional shape having a curved surface on at least one surface thereof.

The height H2 of the curve securing portion 321 may range from about 50% to about 100%, for example, about 60% to about 100%, the height H1 of the printed layer 320. Within this height range, the curve securing portion can prevent generation of cracks at a curved edge of an optical display by relieving stress applied to the polarizing plate due to the curved edge. FIG. 4 shows the structure wherein the height H2 of the curve securing portion 321 ranges from about 50% to less than about 100% the height H1 of the printed layer 320. The curve securing portion 321 may have a height H2 of about 0.1 μm to about 4 μm, for example, about 0.1 μm to about 2.5 μm, specifically about 0.5 μm to about 2.0 μm. Within this height range, the curve securing portion 321 can prevent generation of cracks at the curved edge. The curve securing portion 321, the printed layer 320 and the bonding layer 310 may satisfy the following relationship: Height of the curve securing portion 321≤thickness H1 of the printed layer 320≤thickness of the bonding layer 310.

The width A2 of the curve securing portion 321 may range from about 30% to about 100%, for example, about 30% to less than about 100%, specifically about 30% to about 80%, the width A1 of the printed layer 320 having the curve securing portion 321 formed thereon. Within this width range, the curve securing portion 321 can prevent generation of cracks in the printed layer. FIG. 4 shows the structure wherein the width A2 of the curve securing portion 321 ranges from about 50% to less than about 100% the width A1 of the printed layer 320. The curve securing portion 321 may have a width A2 of about 100 μm to about 3,000 μm, for example, about 500 μm to about 1,000 μm. Within this width range, the curve securing portion 321 can prevent generation of cracks in the printed layer.

The curve securing portion 321 may be formed by a typical method known to those skilled in the art. In one embodiment, the curve securing portion 321 may be formed by coating a composition for the printed layer on one surface of the polarizer protective film 200, applying an engraved pattern for the curve securing portion to the composition, and curing the composition. In another embodiment, the curve securing portion 321 may be formed simultaneously with the printed layer by coating the composition for the printed layer 320. Specifically, the curve securing portion 321 may be formed by repeatedly coating the composition for the printed layer on one surface of the polarizer protective film 200 such that a step is finally formed thereon. Coating may be performed by gravure coating or the like, without being limited thereto.

Next, a polarizing plate according to a further embodiment of the present invention will be described with reference to FIG. 6. FIG. 6 is a cross-sectional view of a polarizing plate according to a further embodiment of the present invention.

Referring to FIG. 6, a polarizing plate 20 according to this embodiment is substantially the same as the polarizing plate 10 according to the above embodiment except that the printed layer 320 of the polarizing plate 20 is directly formed on the polarizer protective film 200, does not contact the polarizer 100, and has a smaller height than the bonding layer 310.

Next, a polarizing plate according to yet another embodiment of the present invention will be described with reference to FIG. 7. FIG. 7 is a cross-sectional view of a polarizing plate according to yet another embodiment of the present invention.

Referring to FIG. 7, a polarizing plate 30 according to this embodiment is substantially the same as the polarizing plate 10 according to the above embodiment except that the printed layer 320 of the polarizing plate 30 is directly formed on the polarizer protective film 200, does not contact the polarizer 100 and has a smaller height than the thickness of the bonding layer 310, and the curve securing portion 321 has the same height as the printed layer 320.

Next, a polarizing plate according to yet another embodiment of the present invention will be described with reference to FIG. 8. FIG. 8 is a cross-sectional view of a polarizing plate according to yet another embodiment of the present invention.

Referring to FIG. 8, a polarizing plate 40 according to this embodiment is substantially the same as the polarizing plate 10 according to the above embodiment except that the printed layer 320 of the polarizing plate 40 is directly disposed on the polarizer protective film 200, does not contact the polarizer 100 and has a smaller height than the thickness of the bonding layer 310, and the curve securing portion 321 is formed in an engraved pattern having one surface open towards an outer surface of the printed layer 320.

Next, a polarizing plate according to yet another embodiment of the present invention will be described with reference to FIG. 9. FIG. 9 is a cross-sectional view of a polarizing plate according to yet another embodiment of the present invention.

Referring to FIG. 9, a polarizing plate 50 according to this embodiment is substantially the same as the polarizing plate 10 according to the above embodiment except that the printed layer 320 of the polarizing plate 40 is directly formed on the polarizer protective film 200, does not contact the polarizer 100 and has a smaller height than the thickness of the bonding layer 310, and the curve securing portion 321 is formed in an engraved pattern having one surface open towards an inner surface of the printed layer 320.

Although not shown in the drawings, the present invention provides a method of manufacturing a polarizing plate, which includes: preparing a polarizer protective film and a polarizer; forming a printed layer having a curve securing portion on an outer periphery of one surface of the polarizer protective film; forming a bonding layer by depositing a bonding agent on one surface of the polarizer protective film having the printed layer formed thereon; and coupling the polarizer to the polarizer protective film such that the printed layer is interposed between the polarizer and the polarizer protective film. A composition for the printed layer may include a pigment, an organic resin binder, a reactive unsaturated compound, a photopolymerization initiator, and a solvent. The composition for the printed layer is the same as described above.

The step of preparing a protective film and a polarizing film are partially described above in description of the embodiments of the polarizing plate, and is well known to those skilled in the art. Thus, a detailed description of this step will be omitted.

The step of forming a printed layer may be performed by coating the composition for the printed layer on the outer periphery of one surface of the polarizer protective film using a micro gravure printer.

Thereafter, the composition for the printed layer may be cured by UV irradiation to form the printed layer. Then, the step of forming a bonding layer may be performed by depositing the bonding agent on one surface of the polarizer protective film having the printed layer formed thereon. By deposition of the bonding agent, the bonding layer may be formed on at least part of a region in which the printed layer of the polarizer protective film is not formed. That is, the bonding layer may be disposed in a space inside the printed layer by depositing the bonding agent. Here, the bonding layer may be formed so as to be placed only between the polarizer and the polarizer protective film.

Thereafter, with the printed layer and the bonding layer interposed therein, the polarizer may be coupled to the polarizer protective film, followed by curing the bonding layer and the printed layer through UV irradiation. However, it should be understood that the present invention is not limited thereto. Alternatively, before coupling the polarizer to the polarizer protective film, pre-curing may be performed by irradiating the printed layer and the bonding layer with UV light. Alternatively, after formation of the printed layer, UV curing, deposition of the bonding agent to form the bonding layer, coupling between the polarizer and the polarizer protective film, and UV curing may be sequentially performed.

The method may further include forming a separate polarizer protective layer on the other surface of the polarizer via a bonding layer interposed therebetween, or forming a primer layer on the other surface of the polarizer and forming an adhesive layer on the primer layer. These processes are well known to those skilled in the art and detailed descriptions thereof will be omitted.

Although not shown in the drawings, the present invention provides an optical display including the polarizing plate according to the embodiments of the invention.

The optical display may include a display panel and a polarizing plate disposed on one surface of the display panel. For example, when the optical display is a liquid crystal display, polarizing plates may be disposed on both surfaces of a display panel of the liquid crystal display. In this structure, the polarizing plate according to the present invention may be disposed at a viewer side on the display panel. In addition, the polarizer protective film having the printed layer interposed between the polarizer protective film and the polarizer may be disposed at the viewer side on the viewer side polarizing plate. That is, the polarizer protective film having the printed layer interposed between the polarizer protective film and the polarizer may be disposed on the outermost side with reference to a viewer, and, since the printed layer is formed on the polarizing plate, the polarizing plate does not require formation of a separate printed layer on a cover window.

When the optical display is a liquid crystal display, a display panel of the optical display may include liquid crystal cells. In this case, the optical display may further include a backlight unit. Since the optical display including the liquid crystal cells is not provided with a self-emissive light source unlike an organic light emitting diode (OLED) panel, the optical display requires a separate backlight unit.

Typically, the liquid crystal cell includes two substrates and a liquid crystal layer interposed between the substrates. In general, a color filter, opposite electrodes, and an alignment layer may be formed on one of the substrates, and a liquid cell-driving electrode, a wiring pattern, a thin film transistor, and an alignment layer may be formed on the other substrate.

The liquid crystal cell may be operated in, for example, a twisted nematic mode or an electrically controlled birefringence mode. The electrically controlled birefringence mode may include a vertical alignment mode, an optically compensated bent (OCB) mode, an in-plane switching (IPS) mode, and the like.

In general, the backlight unit may include a light source, a light guide plate, and a reflective layer. The backlight unit can be classified into a direct type, a side light type, and a surface light type depending upon the structure thereof.

In a structure wherein the display panel is composed of the liquid crystal cells, the polarizing plates may be disposed on both sides of the liquid crystal cells. In this structure, the polarizing plates allow transmission of a light component oscillating in a specific direction among light emitted from the light source of the backlight unit. In a structure wherein the polarizing plates are interposed between the liquid crystal cells, a transmission axis of an upper polarizing plate may be orthogonal or parallel to a transmission axis of a lower polarizing plate.

When the optical display is an organic light emitting display, the polarizing plate may be disposed only at a viewer side of a display panel thereof. When the optical display is an organic light emitting display, the display panel of the optical display may include an organic light emitting diode (OLED) panel. The OLED panel may include pixels, each of which may include an OLED composed of an organic light emitting layer between an anode and a cathode, and a pixel circuit for independently driving the OLED. The pixel circuit includes a switching thin film transistor (TFT), a capacitor, and a driving TFT. The switching thin film transistor can charge a capacitor with a data voltage in response to a scan pulse, and the driving TFT can control the amount of current supplied to the OLED depending upon the data voltage charged in the capacitor, thereby enabling display of an image through control of the amount of light emission from the OLED. The OLED panel is well known in the art and a detailed description thereof will be omitted.

The polarizing plate disposed at the viewer side of the OLED panel may be the polarizing plate according to the present invention. That is, the polarizing plate according to the present invention may be attached to a side of the OLED panel at which a viewer observes an image displayed on the OLED panel. Accordingly, it is possible to prevent deterioration in contrast due to reflection of external light. Since the polarizing plate includes the printed layer therein, there is no need for a separate printed layer for protection of internal devices on a cover window or a sealing layer of the OLED display including the polarizing plate.

The optical display may include a casing that receives devices of the optical display, and a printed circuit board or a touch panel that transfers external signals input from the outside. Further, the optical display may include a cover window that protects internal devices from external impact. Since the polarizing plate according to this invention includes the printed layer, the cover window may not include a separate black matrix, a light shielding layer or a separate printed layer thereon. Details of these components are well known to those skilled in the art and detailed descriptions thereof will be omitted.

Next, the present invention will be described in more detail with reference to some examples.

Examples 1 to 4

A black pigment was used as a pigment dispersion (A) containing 30 wt % of a pigment. Specifically, a pigment dispersion (A-1) comprising a silver-tin alloy (TMP-DC-1, Sumitomo Oosaka Cement Co., Ltd.) (solid content: 30%, weight ratio of silver to tin=7:3) and a pigment dispersion (A-2) comprising carbon black (CI-M-050, Sakata Co., Ltd.) were mixed in an amount ratio as listed in Table 1. An aliphatic polyurethane (SUO-1000, Shina T&C Co., Ltd.) was used as an organic binder resin (B), and dipentaerythritol hexaacrylate (Hanong Chemistry Co., Ltd.) was used as a reactive unsaturated compound (C). In addition, IGR 369 was used as a photo polymerization initiator (D), propylene glycol methyl ether acetate was used as a solvent (E), and a silane coupling agent (765W, Tego Co., Ltd.) was used as a silane coupling agent (F).

In each of Examples 1 to 4, a printed layer was formed between a polarizer and a polarizer protective film (triacetylcellulose film) using a composition prepared by mixing the pigment dispersions, the organic binder resin, the reactive unsaturated compound, the photopolymerization initiator, the solvent, and the silane coupling agent in amounts as listed in Table 1. The printed layer was formed by coating the composition on the polarizer protective film, removing the solvent at 85° C. for 1 minute, and curing the composition at 650 mJ using a metal halide lamp.

In formation of polarizing plates, the thickness of each of the printed layers formed in Examples 1 to 4 was adjusted as listed in Table 1.

Comparative Examples 1 and 2

In formation of each polarizing plate, a printed layer was formed by coating a thermosetting resin composition (EFKA@4015, BASF) and removing a solvent from the composition at 85° C. for 1 minute, followed by curing at 40° C. for 48 hours.

The thickness of each of the printed layers formed in Comparative Examples 1 and 2 was set as listed in Table 1.

TABLE 1

|  | A (wt %) | | B (wt %) | C (wt %) | D (wt %) | E (wt %) | F (wt %) | Thickness of printed layer (μm) |
| --- | --- | --- | --- | --- | --- | --- | --- | --- |
|  | A-1 | A-2 | | | | | | |
| Example 1 | 25 | 20 | 8 | 3 | 3 | 40 | 1 | 0.5 |
| Example 2 | 25 | 20 | 8 | 3 | 3 | 40 | 1 | 1.0 |
| Example 3 | 15 | 30 | 8 | 3 | 3 | 40 | 1 | 1.5 |
| Example 4 | 10 | 35 | 8 | 3 | 3 | 40 | 1 | 2.0 |
| Comparative Example 1 | EFKA@4015 (thermosetting resin, BASF) | | | | | | | 5.0 |
| Comparative Example 2 | EFKA@4015 (thermosetting resin, BASF) | | | | | | | 10.0 |

Experimental Example 1

The polarizing plates prepared in Examples 1 to 4 and Comparative Examples 1 and 2 were evaluated as to coating appearance, light shielding and adhesion, and evaluation results are shown in Table 2.

The coating appearance was observed with the naked eye under a three-wavelength lamp, and light shielding was measured with respect to the printed layer of each of the polarizing plates prepared in Examples and Comparative Examples using a densitometer (TD-904: Gretag Macbeth Company) in accordance with JIS K7651:1988. In Table 2, a printed layer having an optical density of greater than 4.0 was rated as ○ and a printed layer having an optical density of 4.0 or less was rated as ×.

Adhesion was evaluated as adhesive strength between the polarizer and the printed layer and between the polarizer and the polarizer protective film BY a checkboard pattern tape method in accordance with JIS 5600-5-6. In Table 2, a polarizing plate allowing 10% or more of the area of the checkboard pattern to be peeled off was rated as ×, a polarizing plate allowing 5% to less than 10% of the area of the checkboard pattern to be peeled off was rated as Δ, and a polarizing plate allowing less than 5% of the area of the checkboard pattern to be peeled off was rated as ○.

TABLE 2

|  | Thickness of printed layer (μm) | Coating appearance | Light shielding | Adhesion |
| --- | --- | --- | --- | --- |
| Example 1 | 0.5 | Good | ○ | ○ |
| Example 2 | 1.0 | Good | ○ | ○ |
| Example 3 | 1.5 | Normal | ○ | ○ |
| Example 4 | 2.0 | Normal | ○ | ○ |
| Comparative Example 1 | 5.0 | Good | × | ○ |
| Comparative Example 2 | 10.0 | Good | ○ | ○ |

From Table 2, it could be seen that each of the polarizing plates of Examples 1 to 4 had a thinner printed layer than the polarizing plates of Comparative Examples 1 and 2. In addition, the polarizing plates of Examples 1 to 4 did not suffer cracking upon bending. In addition, it could be seen from Table 2 that each of the polarizing plates of Examples 1 to 4 exhibited good properties in terms of coating appearance, light shielding and adhesion while securing a thin thickness.

Examples 5 to 8

Each of polarizing plates was prepared in the same manner as in Examples 1 to 4 except that the printed layer was formed to a thickness as listed in Table 3 and the curve securing portion was formed as shown in FIG. 6.

Comparative Examples 3 and 4

In formation of each polarizing plate, a printed layer was formed by coating a thermosetting resin composition (EFKA@4015, BASF) and removing a solvent from the composition at 85° C. for 1 minute, followed by curing at 40° C. for 48 hours.

The thickness of each of the printed layers formed in Comparative Examples 3 and 4 was set as listed in Table 3.

TABLE 3

|  | A (wt %) | | B (wt %) | C (wt %) | D (wt %) | E (wt %) | F (wt %) | Thickness of printed layer (μm) | Presence of curve securing portion |
|---|---|---|---|---|---|---|---|---|---|
|  | A-1 | A-2 | | | | | | | |
| Example 5 | 25 | 20 | 8 | 3 | 3 | 40 | 1 | 1.0 | Present |
| Example 6 | 15 | 30 | 8 | 3 | 3 | 40 | 1 | 2.0 | Present |
| Example 7 | 10 | 35 | 8 | 3 | 3 | 40 | 1 | 3.0 | Present |
| Example 8 | 10 | 35 | 8 | 3 | 3 | 40 | 1 | 4.0 | Present |
| Comparative Example 3 | EFKA@4015 (thermosetting resin, BASF) | | | | | | | 5.0 | Absent |
| Comparative Example 4 | EFKA@4015 (thermosetting resin, BASF) | | | | | | | 10.0 | Absent |

Experimental Example 2

The polarizing plates prepared in Examples 5 to 8 and Comparative Examples 3 and 4 were evaluated as to coating appearance, light shielding and adhesion, and evaluation results are shown in Table 4.

Crack generation upon bending was observed with the naked eye and observation results are shown in Table 4. Crack generation upon bending was evaluated by a mandrel evaluation method in accordance with JIS K5600. Each of the polarizing plates prepared in Examples and Comparative Examples was cut into a rectangular specimen having a size of 150 mm×40 mm (MD×TD) with reference to the MD and TD of the polarizer.

Referring to FIG. 10, the specimen was wound around a mandrel rod having a diameter of 10 mm by 180° such that the polarizer protective film of the specimen contacted the mandrel rod, and was left for 5 seconds, followed by evaluation of crack generation in the printed layer. Generation of no cracks was evaluated as good and generation of cracks was evaluated as poor.

TABLE 4

| | Thickness of printed layer (μm) | Coating appearance | Light shielding | Adhesion | Generation of crack upon bending |
|---|---|---|---|---|---|
| Example 5 | 1.0 | Good | ○ | ○ | Good |
| Example 6 | 2.0 | Normal | ○ | ○ | Good |
| Example 7 | 3.0 | Normal | ○ | ○ | Good |
| Example 8 | 4.0 | Normal | ○ | ○ | Good |
| Comparative Example 3 | 5.0 | Good | x | ○ | Poor |
| Comparative Example 4 | 10.0 | Good | ○ | ○ | Poor |

From Table 4, it could be seen that each of the polarizing plates of Examples 5 to 8 had a thinner printed layer than the polarizing plates of Comparative Examples 3 and 4. In addition, as shown in Table 4, the polarizing plates of Examples 5 to 8 did not suffer cracking upon bending.

In addition, it could be seen from Table 4 that each of the polarizing plates of Examples 1 to 4 exhibited good properties in terms of coating appearance, light shielding and adhesion while securing a thin thickness.

It should be understood that various modifications, changes, alterations, and equivalent embodiments can be made by those skilled in the art without departing from the spirit and scope of the invention.

The invention claimed is:

1. A polarizing plate comprising:
    a polarizer;
    a polarizer protective film disposed on at least one surface of the polarizer;
    a bonding layer interposed between the polarizer and the polarizer protective film; and
    a printed layer interposed between the polarizer and the polarizer protective film and formed on at least a portion of an edge of the bonding layer,
    wherein the printed layer is formed from a composition comprising about 1 wt % to about 50 wt % of a pigment, about 0.5 wt % to about 20 wt % of an organic binder resin, about 1 wt % to about 20 wt % of a reactive unsaturated compound, about 0.1 wt % to about 10 wt % of a photopolymerization initiator, and the balance of a solvent,
    wherein the printed layer has a curve securing portion formed on a surface thereof, and
    wherein the curve securing portion has an opening on the surface of the printed layer, the opening has a first width, the surface of the printed layer has a second width, and the first width is about 30% to less than about 100% of the second width.

2. The polarizing plate according to claim 1, wherein the printed layer surrounds a circumference of the bonding layer.

3. The polarizing plate according to claim 1, wherein the bonding layer is absent between the polarizer and the printed layer and between the polarizer protective film and the printed layer.

4. The polarizing plate according to claim 1, wherein the bonding layer has a thickness of about 0.5 μm to about 4 μm.

5. The polarizing plate according to claim 1, wherein the printed layer has a thickness of about 0.1 μm to about 2 μm.

6. The polarizing plate according to claim 1, wherein the printed layer is directly formed on the polarizer protective film.

7. The polarizing plate according to claim 6, wherein the curve securing portion is formed on the printed layer to face the polarizer protective film.

8. The polarizing plate according to claim 1, wherein the printed layer has the same or smaller thickness than the bonding layer.

9. The polarizing plate according to claim 1, wherein the curve securing portion is an engraved pattern having a predetermined cross-section.

10. The polarizing plate according to claim 9, wherein the engraved pattern of the curve securing portion has an n-gonal shape composed of n planes or a curved surface on at least one surface thereof.

11. The polarizing plate according to claim 1, wherein the curve securing portion has the same or smaller height than the printed layer.

12. The polarizing plate according to claim 1, wherein the curve securing portion is formed inside one surface of the printed layer.

13. The polarizing plate according to claim 1, wherein the curve securing portion has an engraved pattern having one surface open to an outer surface or an inner surface of the printed layer.

14. An optical display device comprising the polarizing plate according to claim 1.

\* \* \* \* \*